United States Patent
Gong et al.

(10) Patent No.: US 9,478,746 B2
(45) Date of Patent: Oct. 25, 2016

(54) ELECTRON DONOR-FULLERENE CONJUGATED MOLECULES FOR ORGANIC PHOTOVOLTAIC CELLS

(71) Applicants: Xiong Gong, Hudson, OH (US); Stephen Z. D. Cheng, Richfield, OH (US); Wei Zhang, Akron, OH (US)

(72) Inventors: Xiong Gong, Hudson, OH (US); Stephen Z. D. Cheng, Richfield, OH (US); Wei Zhang, Akron, OH (US)

(73) Assignee: The University of Akron, Akron, OH (US)

( * ) Notice: Subject to any disclaimer, the term of this patent is extended or adjusted under 35 U.S.C. 154(b) by 61 days.

(21) Appl. No.: 13/911,351

(22) Filed: Jun. 6, 2013

(65) Prior Publication Data
US 2014/0174536 A1    Jun. 26, 2014

Related U.S. Application Data

(60) Provisional application No. 61/656,220, filed on Jun. 6, 2012.

(51) Int. Cl.
*H01L 51/00* (2006.01)
*H01L 51/42* (2006.01)

(52) U.S. Cl.
CPC ....... *H01L 51/0047* (2013.01); *H01L 51/0077* (2013.01); *H01L 51/0037* (2013.01); *H01L 51/0043* (2013.01); *H01L 51/4253* (2013.01); *H01L 2251/308* (2013.01); *Y02E 10/549* (2013.01)

(58) Field of Classification Search
CPC ............... H01L 51/42; H01L 51/0037; H01L 51/0047; H01L 51/0043; H01L 51/0036; H01L 51/4253; H01L 51/0034; H01L 51/0035; H01L 51/0046
See application file for complete search history.

(56) References Cited

PUBLICATIONS

Wang et al "A Porphyrin-Fullerene Dyad with a Supramolecular "Double-Cable" Structure as a Novel Electron Acceptor for Bulk Heterojunction Polymer Solar Cells", Advanced Materials, May 17, 2011, pp. 2951-2956.*
Tan et al "Synthesis and photovoltaic properties of a donor-acceptor double-cable polythiopehene with high content of c60 pendant", Macromolecules 2007, 40, 1868-1873.*
Covino, "Conjugated polymers with tethered electron-accepting moieties as ambipolar materails for photovoltaics," Poly Int 56: 943-956, 2007.*

* cited by examiner

*Primary Examiner* — Marla D McConnell
(74) *Attorney, Agent, or Firm* — Renner, Kenner, Greive, Bobak, Taylor & Weber

(57) ABSTRACT

A photovoltaic cell has an active area formed electron donor-fullerene conjugated molecules. The electron donor is formed of a polymer, which is conjugated with an electron acceptor, such as fullerene. By conjugating the fullerene, such as $C_{60}$, with electron donor moieties, such as that of the polymer, double channels are formed therebetween, whereby one channel provides hole transport and the other channel provides electron transport. As a result, the electronic coupling between the fullerene and the electron donor moiety leads to increased short-circuit current density ($J_{sc}$) and increased open-circuit voltage ($V_{oc}$), resulting in high power conversion efficacy (PCE) in the solar cell.

8 Claims, 7 Drawing Sheets

US 9,478,746 B2

ELECTRON DONOR-FULLERENE CONJUGATED MOLECULES FOR ORGANIC PHOTOVOLTAIC CELLS

CROSS-REFERENCE TO RELATED APPLICATION

This application claims the benefit of U.S. Provisional Application No. 61/656,220 filed on Jun. 6, 2012, the contents of which are incorporated herein by reference.

TECHNICAL FIELD

Generally, the present invention relates to organic photovoltaic cells. In particular, the present invention relates to photovoltaic cells having an active area formed of electron acceptors with higher lowest occupied molecular orbital (LUMO) energies and with light absorbing molecules. More particularly, the present invention relates to photovoltaic cells having an active area formed from an organic electron donor, such as a polymer, that is conjugated with an electron acceptor, such as fullerene, which forms double channels there between for independent electron and hole transport.

BACKGROUND ART

Bulk heterojunction (BHJ) organic photovoltaic cells (OPVs) provide a low-cost, large-area, flexible, lightweight, clean and quiet alternative energy source for a variety of indoor and outdoor applications. However, the relatively low power conversion efficiency (PCE) and relatively short operational lifetimes of such organic photovoltaic cells is an impediment to their mainstream adoption.

To overcome the deficiencies of OPVs, and to achieve power conversion efficiencies in excess of 10%, bulk heterojunction (BHJ) materials capable of generating high short-circuit current densities (Jsc) and large open-circuit voltages ($V_{oc}$) have been investigated. One approach that has been pursued to increase the short-circuit current density ($J_{sc}$) and the open-circuit voltage ($V_{oc}$) of organic photovoltaic (OPV) cells is to develop low-band-gap semiconducting polymers with deeper highest occupied molecular orbital (HOMO) energies. The pathway to low-band-gap semiconducting polymers with deeper HOMO energies is well established, and the OPV cell fabricated using these semiconducting polymers have yielded high power conversion efficiencies (PCEs).

Still another approach to increasing the short-circuit current density ($J_{sc}$) and the open-circuit voltage ($V_{oc}$) of BHJ OPV cells is to develop electron acceptor materials that absorb more light and with higher lower un-occupied molecular orbital (LUMO) energies. However, the development of such electron acceptor materials lags behind the rate of innovation of organic photovoltaic (OPV) cells.

The construction of molecular structures of a-conjugated molecules via self-assembly has been recognized as an important approach to manipulate their optical and electronic properties to create "molecular" electronics. Specific device configuration often requires explicit molecular arrangements of these electronically active molecular segments. For example, to achieve high power conversion efficiency (PCE) in OPV cells, a bi-continuous interpenetrating structure/morphology with a large interface between the electron donor (D) and electron acceptor (A) and separate channels for electron and hole transport there between is highly desired. In order to keep the electron and hole channels separated, so to retain long charge separation lifetimes, the "double channel" structure has been investigated due to its enhancement in device operating performance. This "double channel" structure typically includes a p-type conjugated polymer electron donor backbone grafted by n-type electron acceptor moieties, such as fullerene ($C_{60}$). However, the traditional grafting approach used to attach the electron acceptor (A) and the electron donor (D) molecules lacks the precise control over both primary chemical and secondary physical structures, and as such, the operating performance of OPV cells formed thereby is compromised.

Thus, while using self-assembly to construct molecular assemblies of these π-conjugated molecules has been recognized as an important approach to manipulate their properties to create "molecular" electronics with dimensions typically at 5~100 nm length scale, specific device configurations often require explicit molecular structures. For example, to achieve bulk heterojunction (BHJ) organic photovoltaic (OPV) cells having high power conversion efficiency (PCE), a bi-continuous network structure with a large electron donor/acceptor interface and separate, independent channel structures for electron and hole transport (i.e. ambipolar structure) is highly desired. While attempts at forming a double-channel polymer with a p-type polymer backbone and n-type electron acceptor moieties have been made, a well-defined, physical "double channel" structure with ambipolar electron/hole transporting properties has yet to be achieved.

Therefore, there is a need for a polymer that is conjugated with fullerene to form an active area of a organic photovoltaic (OPV) cell having double channels for separate, independent electron and hole transport. In addition, there is a need for an electron donor, such as conjugated polymers, conjugated oligomers, and conjugated small molecules, that are conjugated with other organic molecules, such as fullerenes and fullerene derivatives to form organic photovoltaic (OPV) cells having dual channels for separate, independent electron and hole transport. Still yet there is a need for an organic photovoltaic (OPV) cell having an active area formed of a thermally stable and processible discotic liquid crystal (LCs) of $C_{60}$-Por dyad with a self-assembled molecular "double channel" structure. Moreover, there is a need for an organic photovoltaic (OPV) cell having an active area formed of a polymer conjugated with an electron acceptor that are linked together by an ambipolar structure, so as to provide a double channel point of attachment to allow the separate and independent transport of electrons and holes via the channels.

SUMMARY OF THE INVENTION

In light of the foregoing, it is a first aspect of the present invention to provide a photovoltaic cell comprising an at least partially light transparent electrode; an active layer disposed upon the at least partially transparent electrode, the active layer formed of electron acceptor molecules that are conjugated with at least one fullerene, wherein the electron acceptor molecules and the at least one fullerene are attached by a first and a second channel; and a second electrode disposed upon the active layer.

It is another aspect of the present invention to provide a method of forming a photovoltaic cell comprising providing an at least partially light transparent electrode, providing a composite material of electron acceptor molecules conjugated with at least one fullerene, disposing the composite material upon the at least partially light transparent electrode to form an active layer, and disposing a second electrode upon the active layer.

BRIEF DESCRIPTION OF THE DRAWINGS

These and other features and advantages of the present invention will become better understood with regard to the following description, appended claims, and accompanying drawings wherein:

DETAILED DESCRIPTION OF THE INVENTION

Figure 1:
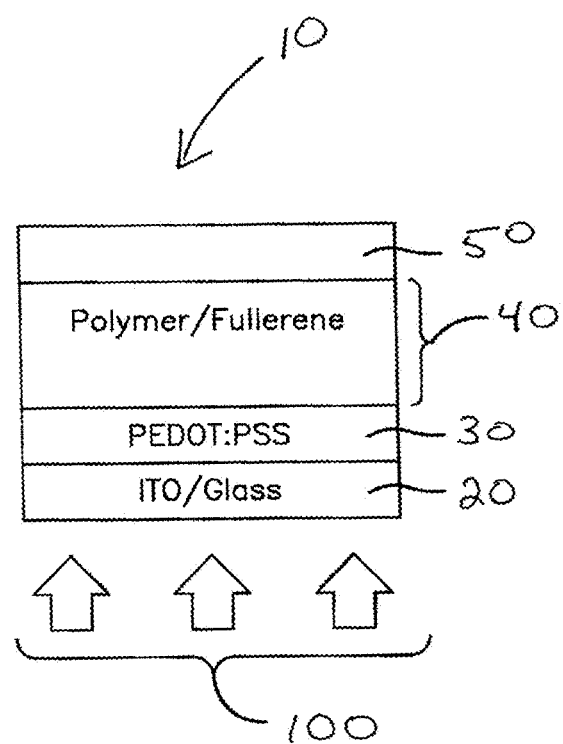
FIG. 1 is a schematic of an organic photovoltaic (OPV) cell having an active area formed of electron donor-fullerene conjugated molecules in accordance with the concepts of the present invention.

An organic photovoltaic (OPV) cell in accordance with the concepts of the present invention is generally referred to by numeral 10, as shown in FIG. 1 of the drawings. The organic photovoltaic (OPV) cell 10 includes an indium-tin-oxide (ITO) substrate or electrode 20 upon which a PEDOT:PSS [i.e. poly(ethylenedioxythiophene), or PEDOT, doped with poly(styrenesulfonate), or PSS] or other suitable buffer layer 30 is disposed. Alternatively, the electrode 20 may comprise any suitable conductive material, such as Al or Ag, or such metal may be combined with ITO, for example. Disposed upon the PEDOT:PSS layer 30 is an active layer 40 formed of a composite of an organic polymer that is conjugated with a fullerene. Finally, disposed upon the active layer 40 is another electrode layer 50, which may be formed of any suitable conductive material. Thus, during operation, the electrode 20, which is at least partially transparent to light, is configured to receive light 100 from any suitable source of solar energy, such as the sun.

The active layer 40 of the solar cell 10 is formed as a composite of at least one polymer or p-type organic molecules, such as a polymer conjugated with at least one fullerene (or fullerene derivative) or n-type organic molecules. That is, it should be appreciated that the at least one conjugated polymer of the solar cell 10 serves as an electron donor (D), and the at least one fullerene serves as an electron acceptor (A). It should also be appreciated that the solar cell 10, including the active layer 40, may be solution processed, such as by spin-casting, dip-casting, drop casting, and may include printing technology, such as spray-coating, dip-coating, doctor-blade coating, slot coating, dispensing ink-jet printing, thermal transfer printing, silk-screen printing, offset printing, gravure printing, and flexo printing for example.

It should be appreciated that in one aspect, the p-type electron donor (D) material of the active area 40 may comprise any suitable organic molecule, including but not limited to conjugated polymers, conjugated oligomers and conjugated small molecules. In addition, it should also be appreciated that in another aspect, the n-type electron acceptor (A) material of the active layer 40 may comprise any suitable organic molecule, including but not limited to fullerene and fullerene derivatives. For example, the n-type electron acceptor (A) material may comprise fullerene $C_{60}$ that is conjugated with a p-type organic polymer material, so as to form the active layer 40 to be discussed.

Specifically, the conjugated p-type and n-type materials forming the active area 40 form a "double channel" structure at their point of molecular attachment, forming well-defined molecular "double channel" structures. These double channels enable the independent or separate movement of holes and electrons between the conjugated acceptor and donor molecules, thus increasing the performance of the photovoltaic cell 10.

Experimental Section

Figure 2:
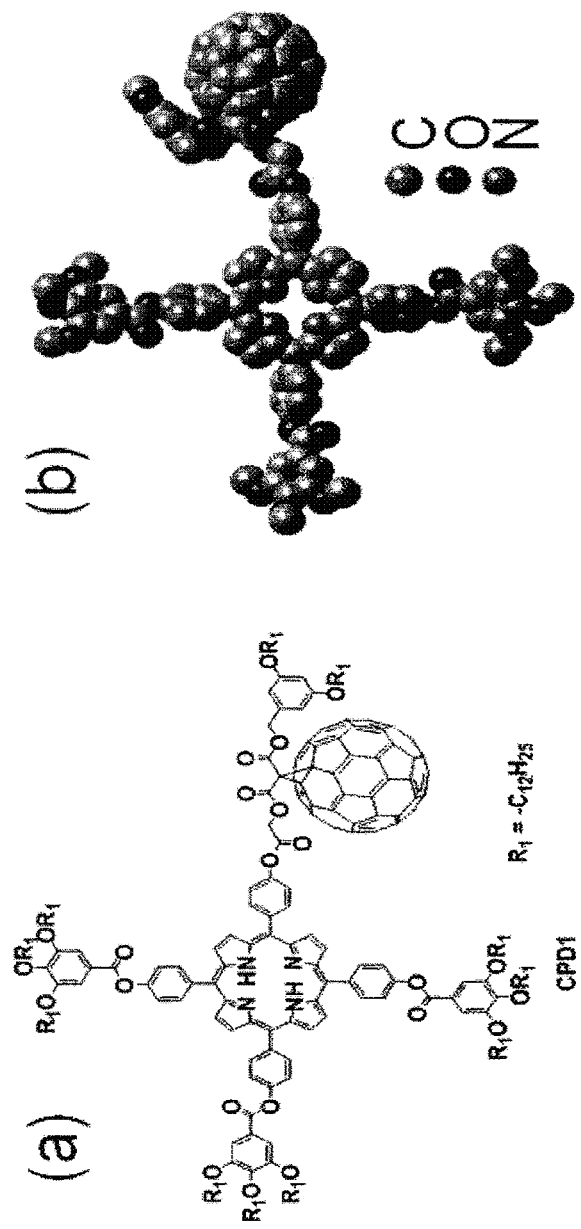
FIG. 2a is a schematic view of the chemical structure of a $C_{60}$-porphyrin dyad (CPD1) in accordance with the concepts of the present invention.
FIG. 2b is a schematic view of the molecular structure of the $C_{60}$-porphyrin dyad (CPD1) of FIG. 2a in accordance with the concepts of the present invention.

In one aspect, the double channel structure formed by the conjugated p-type and n-type materials of the active layer 40 were obtained from room-temperature porphyrin discotic liquid crystals (LCs), where the monomers are assembled through π-π stacking to form p-type columnar channels with pendant, continuous n-type channels, as shown in FIG. 2. Furthermore, the fine-tuning of $C_{60}$ fullerene substituents promotes the intra and inter columnar $C_{60}$ fullerene interactions, leading to distinct molecular structures at a higher length scale. This is different from the molecular complexes of porphyrin and pristine $C_{60}$ fullerene, whose formation relies critically on the solvent used. Thus, the present invention is a thermally stable and processible discotic liquid crystal (LCs) of $C_{60}$-Por dyad with a self-assembled molecular "double channel" structure.

The molecular design of the molecules used to form the active area 40 is based on the formation of a columnar phase in porphyrin liquid crystals (LCs) with pendant, covalently attached $C_{60}$ fullerene. These materials are of interest as the combination of porphyrin as an electron donor (D) and $C_{60}$ as an electron acceptor (A) is known to achieve a highly efficient, long-lived charge separation state, in addition to the desirable processibility and self-healing properties of liquid crystals.

Figure 3:
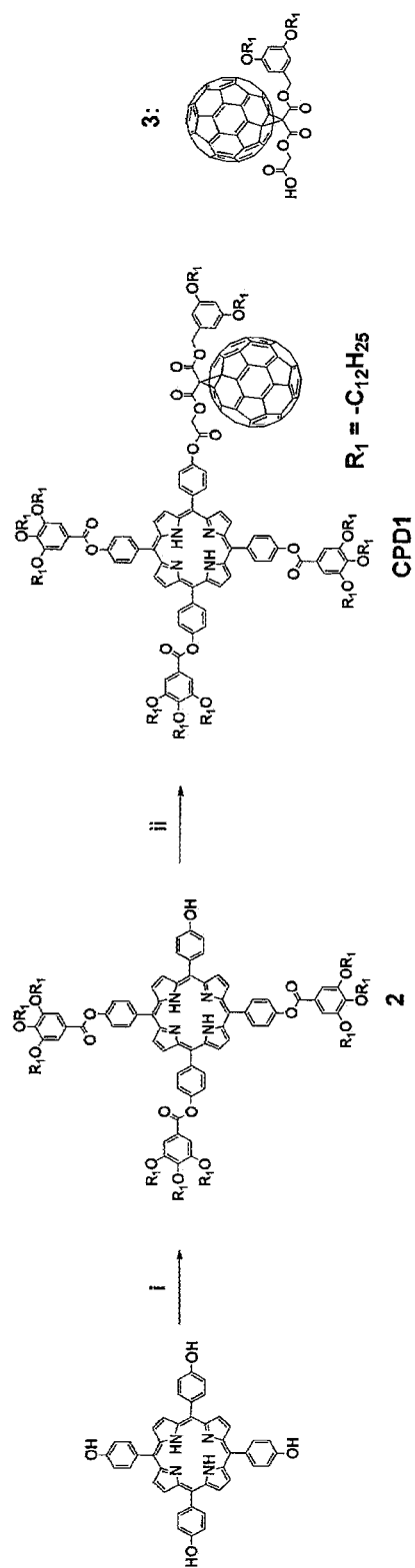
FIG. 3 schematic view of the synthetic route of the $C_{60}$-porphyrin dyad (CPD1) in accordance with the concepts of the present invention.

To obtain a better understanding of the structure-property relationships of the present invention, a single-molecular system is preferred in that it offers precise control over molecular structures and fine-tuning of secondary structures through designed interactions for performance optimization. Therefore, a $C_{60}$-porphyrin dyad (CPD1), as shown in FIGS. 2a-b was designed and synthesized from 5, 10, 15, 20-tetra-(p-hydroxyphenyl) porphyrin in two steps using Steglich esterification. The synthetic route of the CPD1 compound is shown in FIG. 3, whereby the reagents at step (i) included 3,4,5-tris-dodecyloxy benzoic acid, N,N'-Diisopropylcarbodiimide (DIPC), 4-(dimethylamino) pyridinium toluene-p-sulfonate (DPTS), and THF/$CH_2Cl_2$=½, 25° C. Next, at step (ii) of the synthetic route DIPC (N,N'-Diisopropylcarbodiimide), DPTS, 3, $CH_2Cl_2$, 25° C. The products were fully characterized by H-NMR (hydrogen nuclear magnetic resonance) imaging, C-NMR (carbon nuclear magnetic resonance) imaging, and MALDI-TOF (matrix-assisted laser desorption/ionization time-of-flight) mass spectroscopy to confirm their chemical identify and purity. The Steglich esterification provides a yield of ~70% in the synthesis of CPD1. The compound CPD1 is dark-brown and exhibited the liquid crystal phase at room temperature.

Design of Electron Acceptors

The $C_{60}$-porphyrin dyad (CPD1) shows that the porphyrin-fullerene dyad of the present invention with a "double channel" structure allows a controlled ambipolar transporting property with the electron acceptor domain. This double channel structure leads to an improvement in short-circuit current density ($J_{sc}$) and in open-circuit voltage ($V_{oc}$) of the photovoltaic cell 10. Both high $J_{sc}$ and high $V_{oc}$ were also observed from BHJ OPV cells 10 fabricated by these $C_{60}$-porphyrin dyads blended with low-band-gap polymer, as compared with the identical structure of BHJ OPV cells made by the same low-band gap polymer blended with $PC_{61}BM$ fullerene.

Figure 4:
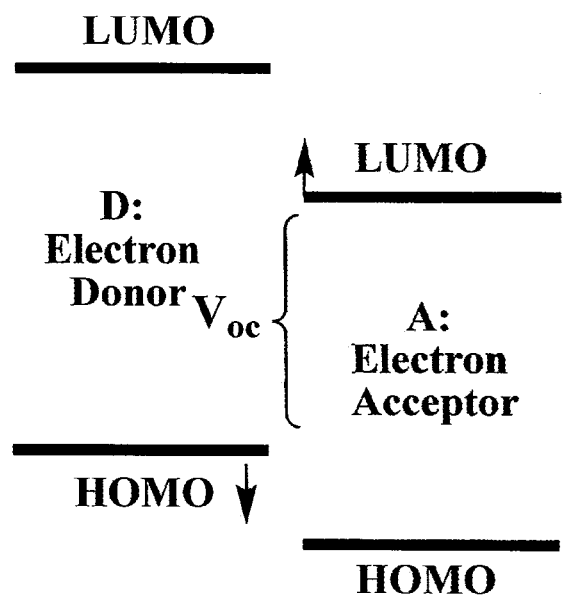
FIG. 4 is a chart showing the energy levels of the electron donors (D) and electron acceptors (A) in a bulk heterojunction (BHJ) organic photovoltaic (OPV) cells.

The fundamental quantities that determine the power conversion efficiency of the photovoltaic cell 10 includes $J_{sc}$, $V_{oc}$, and the fill factor (FF), given by:

$$PCE = \frac{V_{OC} * J_{SC} * FF}{P_{in}}, \quad \text{(Eq. 1)}$$

where $P_{in}$ is the power of the incident light. In BHJ OPV cells, $V_{oc}$ has been correlated with the energy difference between the HOMO of the electron donor (D) and the LUMO of the electron acceptor (A). The correlation between the LUMOs and the HOMOs of the donors (D) and acceptors (A) are shown in FIG. 4. According to the band alignment of the electron acceptors (A) and the electron donors (D) and Eq. 1, high LUMO of the electron acceptors (A) and/or deep HOMO of the electron donors (D) are anticipated for enlarging or increasing $V_{oc}$; and more light harvested by electron donors (D) and electron acceptors (A) are expected for enhancing the short-circuit current density ($J_{sc}$) in the BHJ OPV cells 10. Therefore, the desirable electron acceptors (A) are those with high LUMO and the ability to absorb more light.

Figure 5:
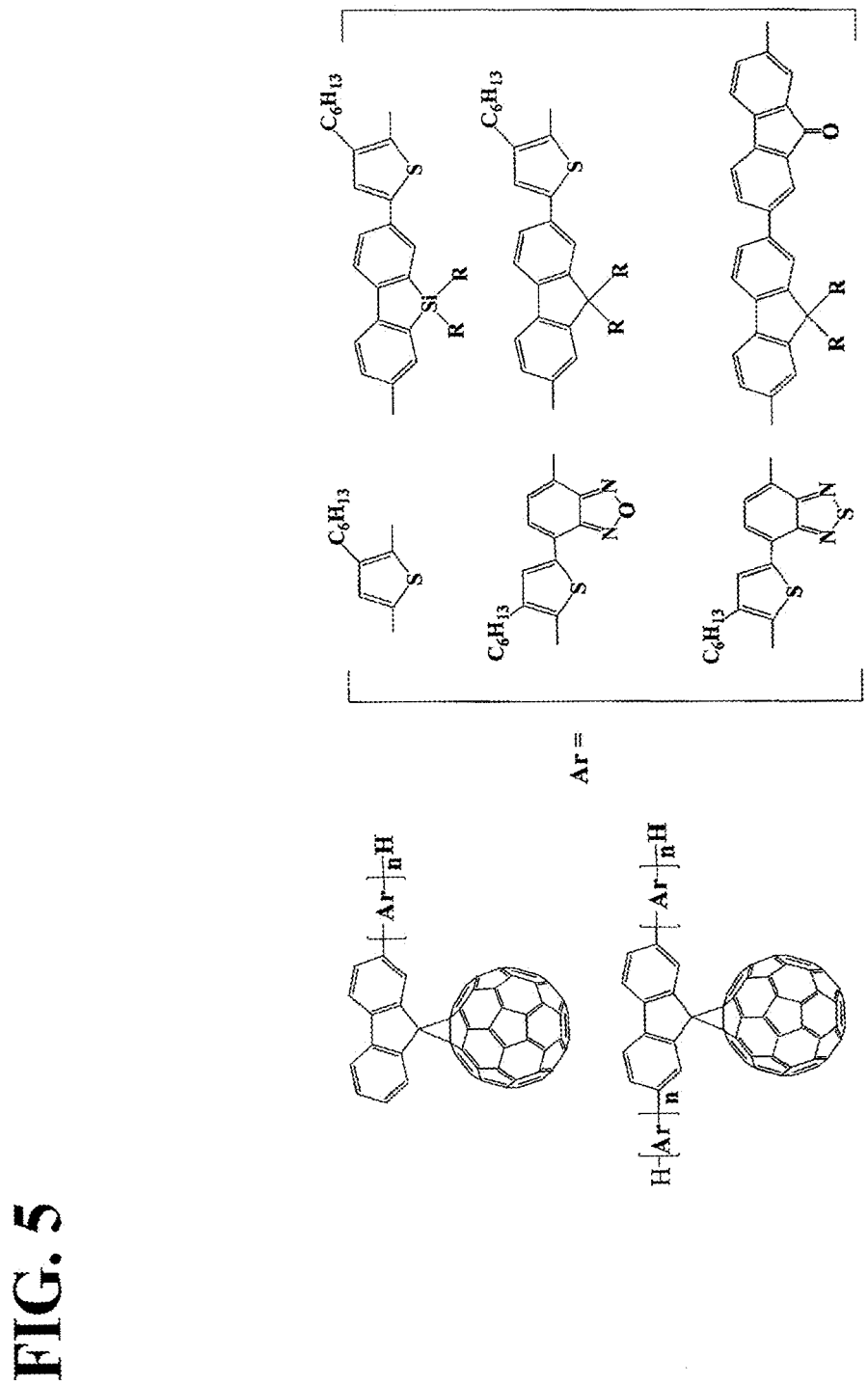
FIG. 5 is a schematic view of the molecular structures of the electron donor-fullerene conjugated molecules used in the active area of the present invention in accordance with the concepts of the present invention.

In order to further enlarge the open-circuit voltage ($V_{oc}$) and enhance the short-circuit current density ($J_{sc}$) of the cell 10, a series of "electron donor-fullerene" conjugated molecules are designed. An example of these electron acceptors (A) contemplated by the present invention is shown in FIG. 5. Thus, by linking $C_{60}$ with "electron donor" moieties, the double-channel structure is formed at their point of attachment, whereby one channel transports holes (i.e. electron donor), and another channel transports electrons (i.e. electron acceptor). Moreover, by conjugating "electron donor" moieties with fullerenes, such as $C_{60}$, rather than covalently attaching the "electron donor" moieties to the fullerenes, the electronic coupling between the "electron donor" moieties and the fullerenes, such as $C_{60}$, is strongly enhanced. As a result, it is contemplated that the high LUMO energies of these novel electron acceptors (A), shown in FIG. 5, can be further increased, leading to a larger $V_{oc}$ for BHJ OPV cells 10 fabricated by the polymers blended with these novel "electron donor-fullerene" conjugated molecules as the electron acceptor. Because the "electron donor" molecules with the "electron donor-fullerene" conjugated molecules, which are shown in FIG. 5, are good light-harvesting molecules, for example, thiophene absorbs more visible light than porphyrin does, a larger short-circuit current density ($J_{sc}$) is also expected to be observed from BHJ OPV formed by the polymers blended with the electron acceptors of the present invention.

Figure 6:
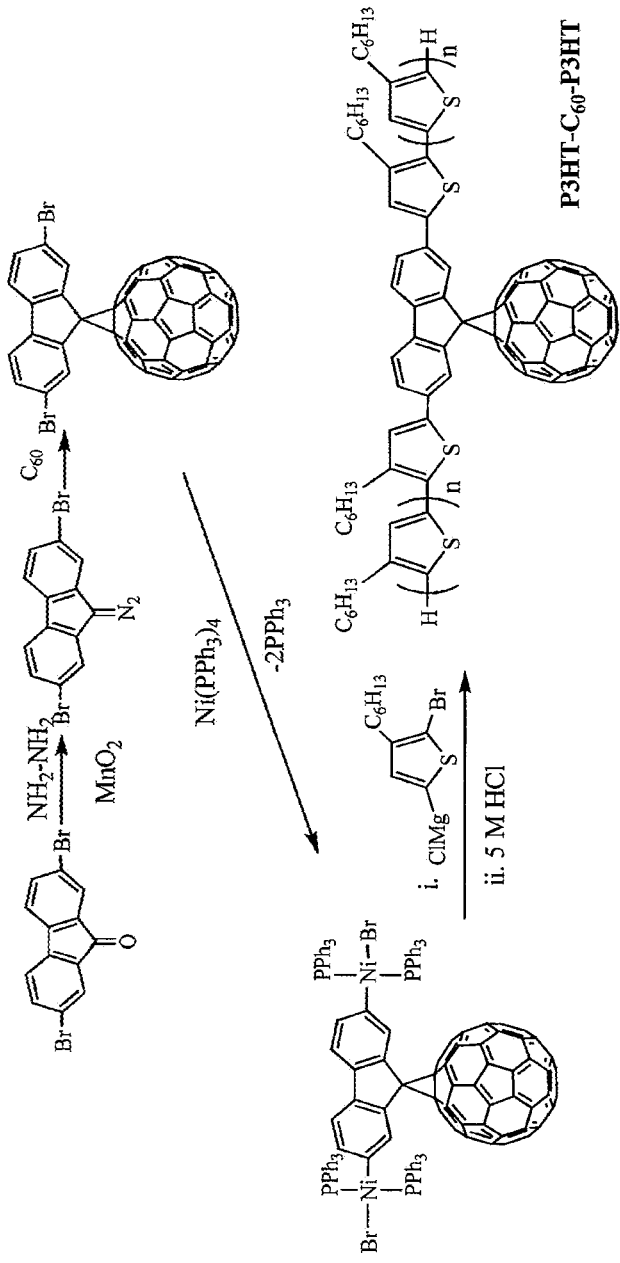
FIG. 6 is a schematic view of the synthetic route of P3HT-$C_{60}$-P3HT.
Figure 7:
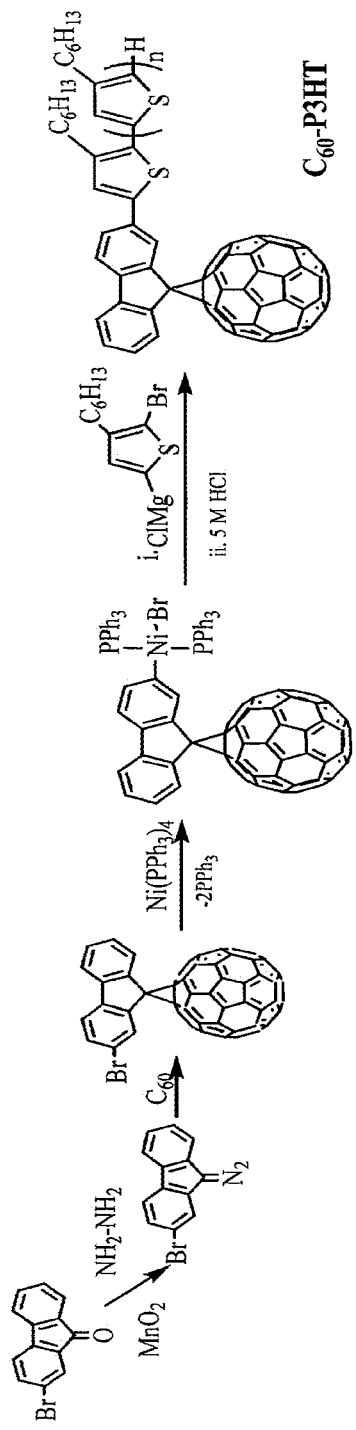
FIG. 7 is a schematic view of the synthetic route of $C_{60}$-P3HT.

In addition, FIGS. 6 and 7 illustrate one example of the synthetic routes for thiophene-$C_{60}$ conjugated molecules for use in the active area 40 of the solar cell 10. The oligomers and polymers of fluorine, silafluorene, and thiophene have been widely used as electron donor (D) materials or building blocks in the co-polymer of the electron donor (D) materials. These materials show efficient light harvesting and charge transfer properties, while possessing high charge motilities in their solid state. These properties make the "electron donor-fullerene" conjugated molecules of the present invention, and as shown in FIG. 5, desirable as electron acceptors (A) for BHJ OPV cells 10. In addition, the "electron donor-fullerene" conjugated molecules of the present invention also improves the compatibility between the components in the blends, providing enhanced definition of morphology of the blends, as well as long term device operating stability.

Therefore, one advantage of the present invention is that an electron donor-fullerene conjugated molecule for an active area of an organic photovoltaic (OPV) cell provides an enhanced operating life. Another advantage of the present invention is that an electron donor-fullerene conjugated molecule increases the short-circuit current density ($J_{sc}$) of an organic photovoltaic cell. Still another advantage of the present invention is that an electron donor-fullerene conjugated molecule increases the open-circuit voltage ($V_{oc}$) of an organic photovoltaic cell. Yet another advantage of the present invention is that double-channel structure of the conjugated electron donor-fullerene increases the power conversion efficiency (PCE) of an organic photovoltaic cell.

Thus, it can be seen that the objects of the invention have been satisfied by the structure and its method for use presented above. While in accordance with the Patent Statutes, only the best mode and preferred embodiment has been presented and described in detail, it is to be understood that the invention is not limited thereto or thereby. Accordingly, for an appreciation of the true scope and breadth of the invention, reference should be made to the following claims.

What is claimed is:

1. A photovoltaic cell comprising:
   an at least partially light transparent electrode;
   an active layer disposed upon the at least partially transparent electrode, the active layer formed of a plurality of electron donor molecules, whereby at least one of the plurality of electron donor molecules is linked through conjugation with at least one fullerene molecule, so as to form a first channel of the electron donor and a second channel of the fullerene, such that holes generated in the active layer are transported by the first channel and electrons generated in the active layer are transported by the second channel; and
   a second electrode disposed upon the active layer, wherein the at least one electron donor molecules linked through conjugation with the at least one fullerene molecule includes the formula

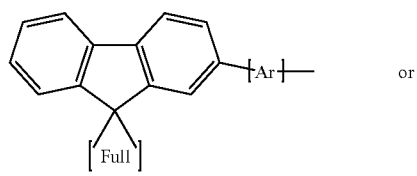 or

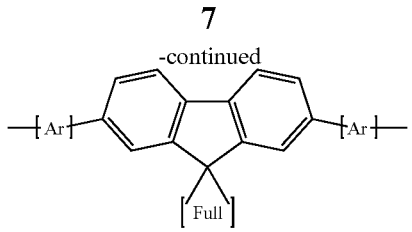

where each Ar is an electron donor molecule and Full is a fullerene molecule.

2. The photovoltaic cell of claim 1, wherein the plurality of electron donor molecules comprise a polymer.

3. The photovoltaic cell of claim 1, further comprising:
a buffer layer disposed between the active layer at least partially light transparent layer.

4. The photovoltaic cell of claim 1, wherein the at least partially light transparent electrode comprises indium-tin-oxide (ITO).

5. A method of forming a photovoltaic cell comprising:
providing an at least partially light transparent electrode;
providing a plurality of electron donor molecules;
linking, through conjugation, at least one of the plurality of electron donor molecules with at least one fullerene so as to form a first channel of the electron donor and a second channel of the fullerene, and forming an active layer such that holes generated in the composite material are transported by the first channel, and electrons generated in the composite material are transported by the second channel;
disposing the active layer upon the at least partially light transparent electrode; and
disposing a second electrode upon the active layer, wherein the at least one of the plurality of electron donor molecules that is linked through conjugation with the at least one fullerene molecule includes the formula

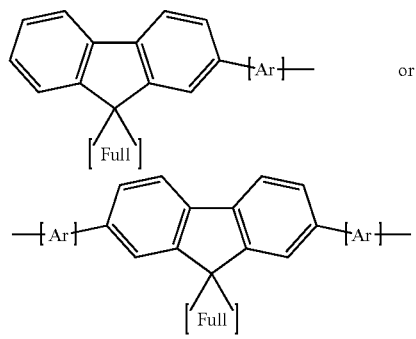

or where each Ar is an electron donor molecule and Full is a fullerene molecule.

6. The method of claim 5, wherein the plurality of electron donor molecules comprise a polymer.

7. The method of claim 5, further comprising:
disposing a buffer layer between the active layer at least partially light transparent layer.

8. The photovoltaic cell of claim 5, wherein the at least partially light transparent electrode comprises indium-tin-oxide (ITO).

* * * * *